US010923170B2

(12) United States Patent
Janesky et al.

(10) Patent No.: US 10,923,170 B2
(45) Date of Patent: *Feb. 16, 2021

(54) DETERMINING BIAS CONFIGURATION FOR WRITE OPERATIONS IN MEMORY TO IMPROVE DEVICE PERFORMANCE DURING NORMAL OPERATION AS WELL AS TO IMPROVE THE EFFECTIVENESS OF TESTING ROUTINES

(71) Applicant: Everspin Technologies, Inc., Chandler, AZ (US)

(72) Inventors: Jason Janesky, Gilbert, AZ (US); Syed M. Alam, Austin, TX (US); Dimitri Houssameddine, Gilbert, AZ (US); Mark Deherrera, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/358,414

(22) Filed: Mar. 19, 2019

(65) Prior Publication Data

US 2019/0214070 A1 Jul. 11, 2019

Related U.S. Application Data

(60) Continuation of application No. 15/401,235, filed on Jan. 9, 2017, now Pat. No. 10,262,713, which is a division of application No. 14/837,381, filed on Aug. 27, 2015, now Pat. No. 9,543,041.

(60) Provisional application No. 62/043,765, filed on Aug. 29, 2014.

(51) Int. Cl.
*G11C 11/16* (2006.01)
*G11C 29/12* (2006.01)
*G11C 29/02* (2006.01)
*G11C 29/50* (2006.01)
*G11C 17/16* (2006.01)

(52) U.S. Cl.
CPC ...... *G11C 11/1673* (2013.01); *G11C 11/1675* (2013.01); *G11C 17/16* (2013.01); *G11C 29/021* (2013.01); *G11C 29/023* (2013.01); *G11C 29/026* (2013.01); *G11C 29/028* (2013.01); *G11C 29/12* (2013.01); *G11C 29/50* (2013.01); *G11C 11/16* (2013.01)

(58) Field of Classification Search
CPC . G11C 11/1673; G11C 11/1675; G11C 11/16; G11C 17/16; G11C 29/021; G11C 29/023; G11C 29/026; G11C 29/028; G11C 29/50; G11C 29/12
See application file for complete search history.

(56) References Cited

U.S. PATENT DOCUMENTS

| 7,283,380 | B1 | 10/2007 | Srinivasan |
| 8,509,003 | B2 | 8/2013 | Lin |
| 9,140,747 | B2 | 9/2015 | Kim |
| 9,543,041 | B2 | 1/2017 | Janesky et al. |

(Continued)

*Primary Examiner* — Sultana Begum
(74) *Attorney, Agent, or Firm* — Bookoff McAndrews, PLLC

(57) ABSTRACT

Techniques and circuits for testing and configuring bias voltage or bias current for write operations in memory devices are presented. Registers and nonvolatile storage is included on the memory devices for storing values used to control testing of the memory devices as well as for configuring parameters related to both testing and normal operation.

17 Claims, 7 Drawing Sheets

(56) References Cited

U.S. PATENT DOCUMENTS

| | | |
|---|---|---|
| 2003/0133334 A1 | 7/2003 | Ohtani |
| 2004/0252551 A1* | 12/2004 | Iwata .................. G11C 11/16 |
| | | 365/158 |
| 2006/0221676 A1 | 10/2006 | Qian |
| 2009/0027065 A1 | 1/2009 | Kuang |
| 2012/0284576 A1 | 11/2012 | Housty |
| 2013/0070519 A1 | 3/2013 | Lin |
| 2013/0128658 A1 | 5/2013 | Alam |
| 2013/0173970 A1 | 7/2013 | Kleveland |
| 2013/0227200 A1 | 8/2013 | Cometti |
| 2013/0314969 A1 | 11/2013 | Kouno |
| 2014/0211550 A1 | 7/2014 | Sun |
| 2014/0226412 A1 | 8/2014 | Yeh |
| 2014/0369124 A1 | 12/2014 | Moon |
| 2015/0043274 A1 | 2/2015 | Liu |
| 2015/0070969 A1* | 3/2015 | Hatsuda .............. G11C 11/1673 |
| | | 365/148 |
| 2015/0348623 A1 | 12/2015 | Lin |
| 2016/0018998 A1 | 1/2016 | Mohan |
| 2016/0055951 A1 | 2/2016 | Kishi |
| 2016/0064058 A1 | 3/2016 | Janesky |

* cited by examiner

DETERMINING BIAS CONFIGURATION FOR WRITE OPERATIONS IN MEMORY TO IMPROVE DEVICE PERFORMANCE DURING NORMAL OPERATION AS WELL AS TO IMPROVE THE EFFECTIVENESS OF TESTING ROUTINES

CROSS REFERENCE TO RELATED APPLICATIONS

This application is a continuation of U.S. patent application Ser. No. 15/401,235, filed Jan. 9, 2017, which is a divisional of U.S. patent application Ser. No. 14/837,381, filed Aug. 27, 2015 (now U.S. Pat. No. 9,543,041, issued Jan. 10, 2017), which claims priority to U.S. Provisional Application No. 62/043,765, filed Aug. 29, 2014, each of which is incorporated herein by reference in its entirety.

TECHNICAL FIELD

The disclosure herein relates generally to spin-torque magnetic memory devices and more particularly to the testing and configuration of aspects of such memory devices.

BACKGROUND

Resistive memory devices store information by controlling the resistance across each memory cell such that a read current through the memory cell will result in a voltage drop having a magnitude that is based on the information stored in the memory cell. For example, in certain magnetic memory devices, the voltage drop across a magnetic tunnel junction (MTJ) in each memory cell can be varied based on the relative magnetic states of the magnetoresistive layers within the memory cell. In such memory devices, there is typically a portion of the magnetic tunnel junction that has a fixed magnetic state and another portion that has a free magnetic state that can be controlled relative to the fixed magnetic state. Because the resistance through the memory cell changes based on the magnetic orientation of the free portion, information can be stored by setting the orientation of the free portion. The information is later retrieved by sensing the orientation of the free portion. Such magnetic memory devices are well known in the art.

Writing to magnetic memory cells can be accomplished by sending a spin-polarized write current through the memory device where the angular momentum carried by the spin-polarized current can change the magnetic state of the free portion. Depending on the direction of the current through the memory cell, the resulting magnetization of the free portion will either be in a first state or a second state relative to the fixed portion. In some spin torque devices, the first and second states correspond to the free portion being parallel to the fixed portion and anti-parallel to the fixed portion, respectively. If the parallel orientation represents a logic "0", the antiparallel orientation represents a logic "1", or vice versa. Thus, the direction of write current flow through the memory cell determines whether the memory cell is written to a first state or a second state. Such memory devices are often referred to as spin torque transfer memory devices. In such memories, the magnitude of the write current is typically greater than the magnitude of a read current used to sense the information stored in the memory cells.

Magnetic memory devices present unique challenges in terms of testing the memory devices for proper functionality and setting configuration parameters that ensure functionality and help optimize device operation. Some of these challenges are based on the basic memory cell architecture used in such memory devices, while others are based on the need to ensure long-term viability of the memory devices after long-term continuous operation. As such, there is a need for techniques and circuitry to support testing and configuration of such memory devices in an efficient and effective manner.

DETAILED DESCRIPTION

Figure 1:
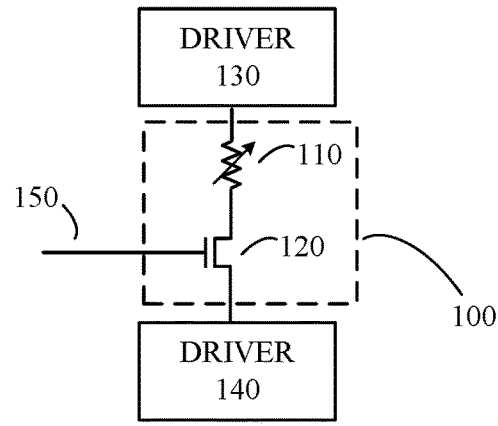
FIG. 1 is a schematic diagram of a magnetic memory cell and accompanying driver circuitry in accordance with an exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to improve understanding of the example embodiments.

The terms "comprise," "include," "have" and any variations thereof are used synonymously to denote non-exclusive inclusion. The term "exemplary" is used in the sense of "example," rather than "ideal." During the course of this description, like numbers may be used to identify like elements according to the different figures that illustrate the various exemplary embodiments.

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices. Similarly, conventional techniques related to reading and writing data in memory cells, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Nonvolatile memory devices are often used in various applications in order to store data that remains valid after power is no longer applied. Examples of such nonvolatile memory devices include resistive memory devices such as MRAMs in which the resistance experienced by current flowing through the memory cell varies based on the orientation of magnetic vectors within the memory cell and where such resistance variations are used to store data. As noted above, spin torque memory devices send a current through the magnetoresistive stack in order to store information in a magnetic tunnel junction within a memory cell. Depending on the direction of the current, and assuming it has adequate magnitude, the free portion of the magnetic tunnel junction will be forced into a corresponding magnetic state indicative of the information to be stored in the cell.

Magnetic memory devices typically include a large array of memory cells. Testing the various aspects of magnetic memory devices can occur at different stages of the memory device manufacturing process. For example, some test operations are performed at wafer probe, which is when a plurality of memory device chips are part of a single substrate wafer. In many cases, the testing performed at wafer probe is coarse in the sense that it is intended to quickly identify defective chips to be eliminated before further processing. Minimizing the amount of time required for testing during wafer probe is desirable as it increases the efficiency of the manufacturing process. As such, limiting what testing is performed at wafer probe, and how long that testing requires, helps to decrease manufacturing costs. At the same time, reasonably thorough testing at wafer probe allows bad die to be quickly identified and discarded, thereby reducing costs and increasing overall manufacturing efficiency.

In addition to verifying basic device functionality, which may be accomplished through a testing routine performed at wafer probe, the long-term viability of magnetic memory devices is also important. Typical memory devices include a large array of memory cells, where each memory cell includes a selection transistor coupled in series with a magnetoresistive device that includes a magnetic tunnel junction. The magnetic tunnel junctions and select transistors included in each of the memory cells can break down after periods of continued usage. It may be impractical to adequately exercise the magnetic memory devices during wafer probe to determine the expected longevity of the individual memory devices. As such, additional testing following wafer probe is performed to intentionally stress the various aspects of the magnetic memory devices in a manner that provides some assurance as to the long-term viability of the various components therein. Such subsequent testing may be performed post-packaging, for example during a "burn-in" or similar procedure during which different portions of the device are repeatedly cycled to stress the various components of the device. As also discussed below, techniques are presented herein for reducing the time required to adequately exercise the parts during such testing procedures while still ensuring that the device components are stressed in the desired manner.

In addition to verifying functionality, testing can also be used to determine operating characteristics of each memory device, where such characteristics may vary from one device to the next. Determining and selectively configuring various parameters used by each memory device during operation allows for improved performance for each individual device. For example, applying a slightly higher bias voltage across the memory cells in one memory device may improve performance. As another example, parameters related to sense amplifiers, which are used to detect the data states stored in the memory cells, can be adjusted to improve the sensing capabilities of the sense amplifiers, thereby increasing the reliability with which the data is retrieved from the memory cells. As discussed below, techniques are presented herein for determining appropriate settings for certain parameters associated with magnetic memory devices, where those settings can be used to improve device performance during normal operation as well as to improve the effectiveness of testing routines. In some embodiments, certain operating characteristics for the magnetic memory devices are determined at one stage in the testing process, where such operating characteristics are stored in nonvolatile storage (e.g. fuses) on the individual memory devices for later use in subsequent testing and/or normal operation.

In some cases, it may be desirable to stress certain aspects of the memory devices to the point of failure. For example, stressing a selected set of memory cells may proceed to the point where the memory cells fail. Knowing when such failure occurs can be used to determine appropriate settings for other memory cells on the device to help avoid their failure while improving functionality. Because the components pushed past their limits are no longer functional, in some embodiments, the use of selected portions of the memory device for testing is used, where the memory cells included within the selected portions are either not intended to be included in normal operation or are redundant in the sense that they are not needed for normal operation. In some embodiments, the memory cells and circuitry associated with the memory cells included in these selected portions used for testing are different in certain aspects in comparison with the memory cells included in the array that are used for normal operation. Such non-standard components or configurations of components allow for a wider range of testing stimulus to be applied, thereby aiding in determining the functional range for the memory cells used during normal operation. Thus, the various embodiments presented herein concern testing magnetic memory devices to ensure that they are operating correctly, stressing various aspects of the memory devices to ensure long-term viability, and configuration of various parameters associated with the memory devices to help optimize their operation during both testing and normal operation. One or more registers included in each memory device can be used to control or direct the testing and configuration operations performed. For example, initial bias levels used during testing may be stored within a register, where the initial bias levels are written to the register prior to certain test routines being performed. Registers can also be used to store test patterns used in exercising the memory devices or to store other parameters or settings that help improve the effectiveness and efficiency of the testing and configuration operations performed.

FIG. 1 illustrates a schematic diagram of a memory cell 100 coupled between a driver 130 and a driver 140. Although not shown, address decoding, selection, or other access circuitry is typically coupled between the drivers 130 and 140 and the memory cell 100. The memory cell 100 includes a selection transistor 120 and a magnetoresistive device 110, wherein the magnetoresistive device 110 includes a magnetic tunnel junction. A word line 150 is coupled to the gate of the selection transistor 120. When the appropriate voltage is applied on the word line 150, current is enabled to flow through the series circuit formed by the selection transistor 120 and the magnetoresistive device 110. As noted above, different currents can be sent through the magnetoresistive device 110 during reading and writing operations. Furthermore, write current direction can be in two possible directions to write two states in magnetoresistive device 110.

In order to provide the different currents through the memory cell 100, drivers 130 and 140 can be configured to either source or sink specific current levels or be configured to apply a particular voltage across the memory cell 100 that will result in the desired current. In some embodiments, the drivers 130 and 140 are NMOS-follower (N-follower) or PMOS-follower (P-follower) circuits that apply high and low voltages at the edges of the memory cell 100. For example, for a down-current write a higher voltage may be applied by the driver 130, which may be an N-follower circuit, and a lower voltage may be applied by the driver 140, which may be a P-follower circuit. This causes current to flow in a downward direction through the magnetoresistive device 110, and, if that current has sufficient magnitude, it forces the free portion of the magnetoresistive device 110 into the state corresponding to a down-current write. The state of the magnetoresistive device 110 after a down-current write corresponds to one of the two binary values that can be stored in the memory cell. For example, the state of the memory cell 100 after a down-current write may correspond to a logic "0". In order to write the other state to the memory cell 100 (e.g. that corresponding to a logic "1"), the drivers may be swapped such that driver 140 is an N-follower circuit that drives a higher voltage and driver 130 is a P-follower circuit that drives a lower voltage, thereby resulting in current flow in an upward direction, which, if such current is of sufficient magnitude, can force the free portion of the magnetoresistive device 110 into the state corresponding to an up-current write (e.g. such that it stores a "1"). The currents and voltage levels applied by the drivers 130 and 140 can be controlled and configured in order to optimize device operation. Specific examples of drivers that use N-follower and P-follower circuits and techniques for controlling those circuits can be found in U.S. patent application Ser. No. 14/580,379, which is incorporated by reference herein. Notably, while N- and P-follower drivers are discussed with respect to the embodiments described herein for illustrative purposes, other driver configurations can be used to generate the appropriate voltages/currents for reading and writing the memory cells.

As can be seen from FIG. 1, each memory cell includes two separate components whose operation is necessary for proper memory cell functionality. As such, while simple functional testing can verify that both the magnetoresistive device 110 and a selection transistor 120 are functioning under a certain set of conditions at a particular point in time, each of those components may eventually fail due to problems associated with the particular component. For example, the selection transistor 120 is often a thin oxide transistor that is designed to allow for maximum current flow with limited transistor area. Such transistors are susceptible to time-dependent dielectric breakdown of the transistor's gate oxide. Such breakdown may occur due to repeated application of a relatively high gate-to-source voltage ($V_{GS}$) used to ensure adequate current flow for the desired operation of the magnetoresistive device 110. Notably, different voltages may need to be applied to the gate of the selection transistor 120 by the word line 150 in order to achieve the desired gate-to-source voltage, where the applied word line voltage depends on the desired magnitude and direction of current flow (up-current or down-current) as well as the voltages applied across the entirety of the memory cell 100 by the drivers 130 and 140.

In the case of the magnetoresistive device 110, repeated current flow through the various layers making up the magnetoresistive device 110 for read and write operations may result in breakdown or shorting of layers within the magnetoresistive device 110. The potential problems associated with the magnetoresistive device 110 may be independent of potential problems associated with the selection transistor 120. As such, it is useful to independently verify the long-term viability of these components for memory cells to provide some assurance that the overall memory device will function over its expected lifetime within expected parameters.

Figure 2:
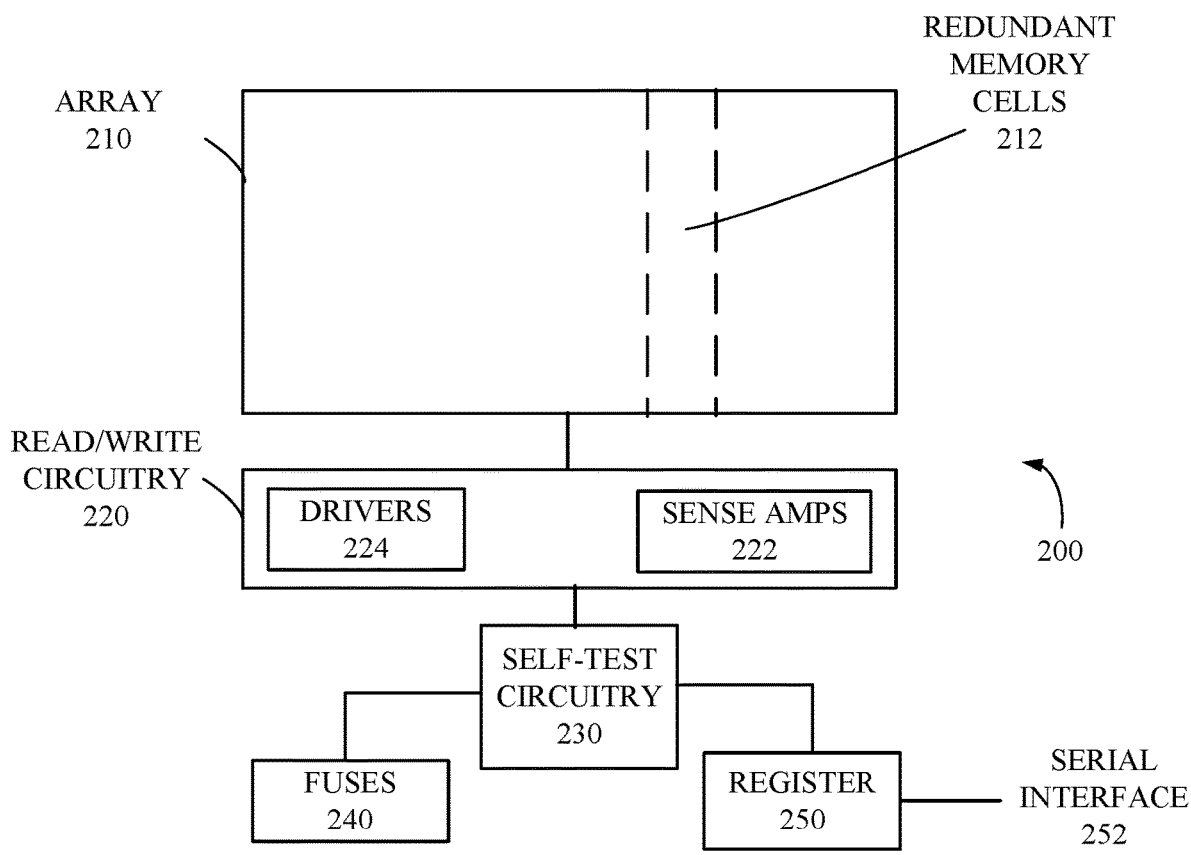
FIG. 2 is a block diagram of a portion of a magnetic memory in accordance with an exemplary embodiment.

FIG. 2 illustrates a schematic block diagram of a portion of a magnetic memory device 200. Device 200 includes an array of memory cells 210, read/write circuitry 220, self-test circuitry 230, fuses 240, and a register 250. As discussed above, the array 210 may include redundant memory cells 212. As noted above, the redundant memory cells 212 may be similar to or different from memory cells in the array 210 that are used for normal memory operations. For example, some of the redundant memory cells 212 may include larger or differently-configured selection transistors that enable higher current flow through the memory cell in order to more fully exercise the magnetoresistive device coupled in series with that oversized selection transistor. In other embodiments, the selection transistors corresponding to a group of memory cells may be coupled together in parallel to provide a lower-resistance series path for a particular magnetoresistive device, thereby accomplishing a similar result as that achieved with an oversized transistor.

In other embodiments, memory cells within the set of redundant memory cells 212 may include magnetoresistive devices that are a typical with respect to those used for normal memory operations, where the selection transistors have the same or similar characteristics as those used for normal memory operations. For example, higher-resistance or different-sized magnetoresistive devices may be used that allow for more extensive testing of the selection transistors. In other embodiments, rather than having actual magnetoresistive devices in series with selection transistors, the redundant memory cells may include mock magnetoresistive devices, such as resistors or other configurable components that are substituted in a series connection with a selection transistor to provide other options for fully exercising or testing the limits of the selection transistors.

In some embodiments, the redundant memory cells 212 are included within the array 210 that contains the memory cells used in normal operation. In such embodiments, the processing steps used to form the redundant memory cells 212 are likely to closely track those used to create the memory cells used during normal operation. In some embodiments, inclusion of the redundant memory cells 212 within the array 210 is beneficial in that cells included within the redundant memory cells 212 can be substituted or mapped into or out of the address space with which memory cells in the array 210 are accessed. For example, while the redundant memory cells 212 may be initially used for testing purposes, they may also serve as backup cells that can be used to replace any defective cells detected within the array 210 during normal operation. In other embodiments, the redundant memory cells 212 may be located outside of the array of memory cells used during normal operation.

The read/write circuitry 220 includes sense amplifiers (sense amps) 222 as well as drivers 224, where drivers 224 may include N-follower and P-follower drivers such as drivers 130 and 140 discussed with respect to FIG. 1 above. Thus, the drivers 224 provide the ability to drive current through, or establish a particular voltage across, the various memory cells within the array 210. While not shown, the row/column decode or other selection circuitry typically allows for smaller sections of the array 210 to be selected and accessed by the read/write circuitry 220.

The sense amplifiers 222 are used to determine the individual data states stored in each of the memory cells. Typically, the array is divided into portions, which may be referred to as "pages," where there is a corresponding sense amplifier for each memory cell included in a page. In some embodiments, a page corresponds to a row of memory cells within the array. Thus, hundreds or thousands of sense amplifiers are simultaneously used to detect the data state stored in a corresponding set of memory cells within a particular page of the memory array. Once each of the sense amplifiers has determined the data state stored within its corresponding memory cell in the page, that information can either be directly accessed in the sense amplifiers for read and write operations, or the data may be transferred to temporary storage registers that are accessed for read and write operations. While the sense amplifiers typically sense and detect the data states corresponding to a very large number of memory cells (e.g. hundreds or thousands), normal read/write operations access a small subset of the memory cell data states available in data storage elements in the sense amplifiers or data storage elements coupled to the sense amplifiers (e.g. temporary storage registers). For example, a write operation may only write the data corresponding to 16 or 64 memory cells.

Loading a set of data states corresponding to a page of memory cells from the array into the temporary storage of the data storage elements may be referred to as an activate operation. Once the activate operation has loaded the data states into the data storage elements, read and write operations to the data can occur. Performing an activate operation is often referred to as "opening" a page of memory. Following any read/write accesses to the open page, a precharge operation is used to store the resulting data back into the memory cells in the array corresponding to the page that was activated. Such a precharge operation is commonly referred to as "closing" the page in that the data for the page is no longer accessible for read/write operations without performing a subsequent activation operation to reopen the page.

In some embodiments, activate operations detect the data state for each memory cell in the page using a self-referenced read operation. During a self-referenced read operation, a first sensing operation for each memory cell in the page is performed. The first sensing operation is accomplished by sending a read current through the memory cell to detect the resistance of the memory cell. In some embodiments, the resistance is detected by measuring the voltage drop across the memory cell. The results of the first sensing operation can then be stored in circuitry on the memory device, for example in a capacitive circuit.

After performing the first sensing operation, a write current is applied through each memory cell in the page to store a first data value in all of the memory cells in the page. Thus, the drivers 224 shown in FIG. 2 are first used to send a read current through the memory cell to sense its initial state, and then, after the initial state has been detected, the drivers 224 force all of the memory cells in the page to a known first state. Following the application of the write current, a second sensing operation for each memory cell in the page occurs. The data value stored in each of the memory cells can then be determined based on the first sensing operation and the second sensing operation. For example, if the resistance through the memory cell is generally the same for both the first and second sensing operations, then the write current that forced that particular memory cell to the known first state did not change the state of the magnetoresistive device within that memory cell. However, if a significant resistance change is detected, then the writing operation must have changed the state of the magnetoresistive device within the memory cell, thereby either increasing or decreasing the resistance across that magnetoresistive device. As such, detection of a difference in resistance between the two sensing operations indicates that the memory cell was initially in a second state and not in the first state to which all of the memory cells were forced during the activate operation.

In order to help detect the difference in resistance corresponding to the different states stored within the memory cells, a sense amplifier offset may be employed to skew one of the inputs used for the comparison. For example, an offset current may be applied during one of the sensing operations. In one embodiment, a small offset current may be applied during the second sensing operation such that a simple comparison with the results of the first sensing operation will readily identify the initial state of the memory cell. A sample voltage, Vsample, is stored based on the current through the memory cell when a read voltage is applied during the first sensing operation. The same read voltage is applied during the second sensing operation, and the resulting current through the memory cell is summed with an offset current to create an evaluation voltage Veval. The difference between Vsample and Veval helps sense the state of the bit.

For example, (using numbers that are not to scale for illustrative purposes), if the memory cell did not switch between the first and second sensing operations and no offset current is applied, current through the bit would be the same resulting ideally in the same magnitude for Vsample and Veval. If the memory cell does switch between the first and second sensing operations and no offset current is applied, in this example Vsample is 10 mV greater than Veval. When an offset current is applied during the second sensing phase, in this example the offset current adds 5 mV to Veval. As such, when the offset current is applied and the memory cell doesn't switch between the first and second sensing operations, Veval is greater than Vsample by 5 mV. When the offset current is applied and the memory cell does switch, Vsample is greater than Veval by 5 mV. The difference between Vsample and Veval, +5 mV or −5 mV can be used to determine the initial state of the bit. As such, a simple greater than/less than comparison can be used by the sense amplifier to determine the initial data state stored in the memory cell. While the example embodiment described herein employs an offset current, it should be appreciated that other offsets intended to skew one or more of the sensing operations employed to achieve similar results. For example, a small amount of voltage or charge can be added to the result of the first sensing operation in order to intentionally offset those results from the second sensing operation.

As noted above, once the page is opened by the activate operation, read and write operations to the data can be performed. After the read and write operations corresponding to the activated page are complete, the precharge operation is used to store the resulting data states back into the memory cells for the page that is being closed. Because the activate operation leaves all of the memory cells in the array corresponding to the page in the first state, only those memory cells that will be storing the second state need to be written to during the precharge operation. As such, write current is typically only applied through a portion of the plurality of memory cells in the page during a precharge operation, whereas during an activate operation using a self-referenced read operation, write current is sent through all of the memory cells in the page. Notably, the write current applied during an activate operation is in a first direction, whereas the write current applied to store the second state in certain memory cells during the precharge operation is in a second direction that is opposite the first direction. For example, if the activate operation places all of the memory cells in the page in the first state using a down-current write, up-current write operations are used during the precharge to store the second state within the appropriate memory cells.

While the activate, read/write, and precharge commands provide the means to access data stored within the array 210 during normal operation, testing all of the memory cells using conventional commands would consume a large amount of time and effort. For example, cycling an entire page of memory cells through both an up-current write and a down-current write would require first activating the page, then writing the data value for each corresponding address in the page to the second state, and finally performing a precharge operation. Activating the page forces a down-current write through all of the memory cells in the page, which is efficient for test operations corresponding to the down-current write. However, because conventional read/write commands only modify a small portion of the data corresponding to a page, multiple write commands would be required to force the second state into all of the data storage registers corresponding to the open page. Having to perform those multiple write commands to ensure the data states for the entire page are in the second state such that the precharge operation causes an up-current write through all of the memory cells in the page is very inefficient.

One technique that can help increase speed and efficiency of fully exercising entire pages within the memory array includes skewing the activate operation such that rather than detecting the actual data stored in each of the memory cells for the page, the sense amplifiers determine that either the first data value or the second data value is stored in each and every memory cell of the page regardless of the actual data value stored in each memory cell. In some embodiments, such a customized activate operation can be accomplished by adjusting the sense amplifier offset applied during the activate operation such that the sense amplifiers always detect either the first state or the second state as being stored in each and every memory cell in the page regardless of what is actually stored in the memory cell. In the example discussed above, the offset current could be increased by a significant margin such that the second sensing operation always produces a result (Veval) that is greater than what was detected during the first sensing operation (Vsample). In the example above where the offset current adds 5 mV of voltage during normal operation, the offset current could be increased to add 15 mV so that the second sensing operation always produces a higher Veval voltage than the first operation Vsample.

In other embodiments, in order to skew the activate operation other read parameters can be adjusted corresponding to reading data stored in the array of memory cells where the read parameters are adjusted to result in the same data value being determined for each memory cell during the activate operation regardless of the corresponding actual data value stored in each memory cell. Another read parameter that can be adjusted is the read bias level applied across each memory cell during the sensing operation. Changing the read bias level, or voltage applied across the memory cell during a sensing operation, can be used to intentionally skew the results of the sensing operation such that the same state is determined for each memory cell during the activate operation. For example, the voltage applied across the memory cell during the first sensing operation could be adjusted to be lower than that applied during a corresponding sensing operation during normal memory operation.

In some embodiments, placing the memory device into a test mode that utilizes the custom, intentionally-skewed activate operations is controlled by setting one or more bits in a register such as the register 250 depicted in FIG. 2. Such a register can also include a value that indicates the amount of skew to be applied either in terms of a different sense amplifier offset, read bias level, or other read parameter. Thus, in some embodiments, the amount of skew applied during the activate operation can be controlled based on register settings. As shown in FIG. 2, the register 250 may be accessed via a serial interface 252 to supply the values used to adjust the appropriate parameters during the intentionally-skewed activate operation. In some embodiments, the serial interface 252 is associated with a serial scan chain commonly used for testing operations. One example of standardized serial scan chain is that developed by the Joint Test Action Group (JTAG). In other embodiments, the appropriate parameter settings may be stored in fuses 240, where the parameter settings may be determined as a part of earlier testing where the results are preserved in the settings of the fuses 240. While not shown in FIG. 2, any parallel interface, such as double data rate (DDR), may also be used to access the register 250.

Thus, while the skewed activate operation proceeds normally in terms of sensing, writing, and sensing again, the output of the sense amplifiers is different than what would be the case in normal operation. Notably, skewing the sense amplifiers or skewing the read bias voltage applied across the memory cells does not affect the current used during the write portion of the activate operation, thereby ensuring that normal-operation write current is still used during the skewed activate operation. However, because the output of the activate operation is manipulated so that all of the bits are determined to be in the same one of the two predetermined states, the write back that occurs during a precharge operations is manipulated so that all of the memory cells are written back to instead of only a portion of the memory cells in the page. As such, write current in both the first direction (e.g. down-current write) and the second direction (e.g. up-current write) is applied through each and every memory device within the page during the activate and precharge operations. This is accomplished without the need for manipulation of the data in the sense amplifiers or data storage registers using multiple write operations after the activate operation and before the precharge operation. By having all of the memory cells in a single page written to at the same time in the up-current direction and the down-current direction, the total current draw for such operations can be monitored from external to the memory device 200, thereby providing valuable test information about worst-case current draw during activate and precharge operations.

Notably, while examples such as skewing the sense amplifier offset and adjusting the read bias voltages are provided herein, other techniques can be used to force the output of the sense amplifiers during an activate operation to a predetermined state or to accomplish the same objective. For example, AND, INV, and OR logic based circuitry or other circuitry can be included to force the values in the temporary data storage registers to a known state. Other techniques for forcing the sense amplifiers to detect a desired predetermined state or to force a known set of values into the data storage registers can also be used, including dedicated circuitry that may also be controlled by values in the register 250 or fuses 240.

Figure 3:
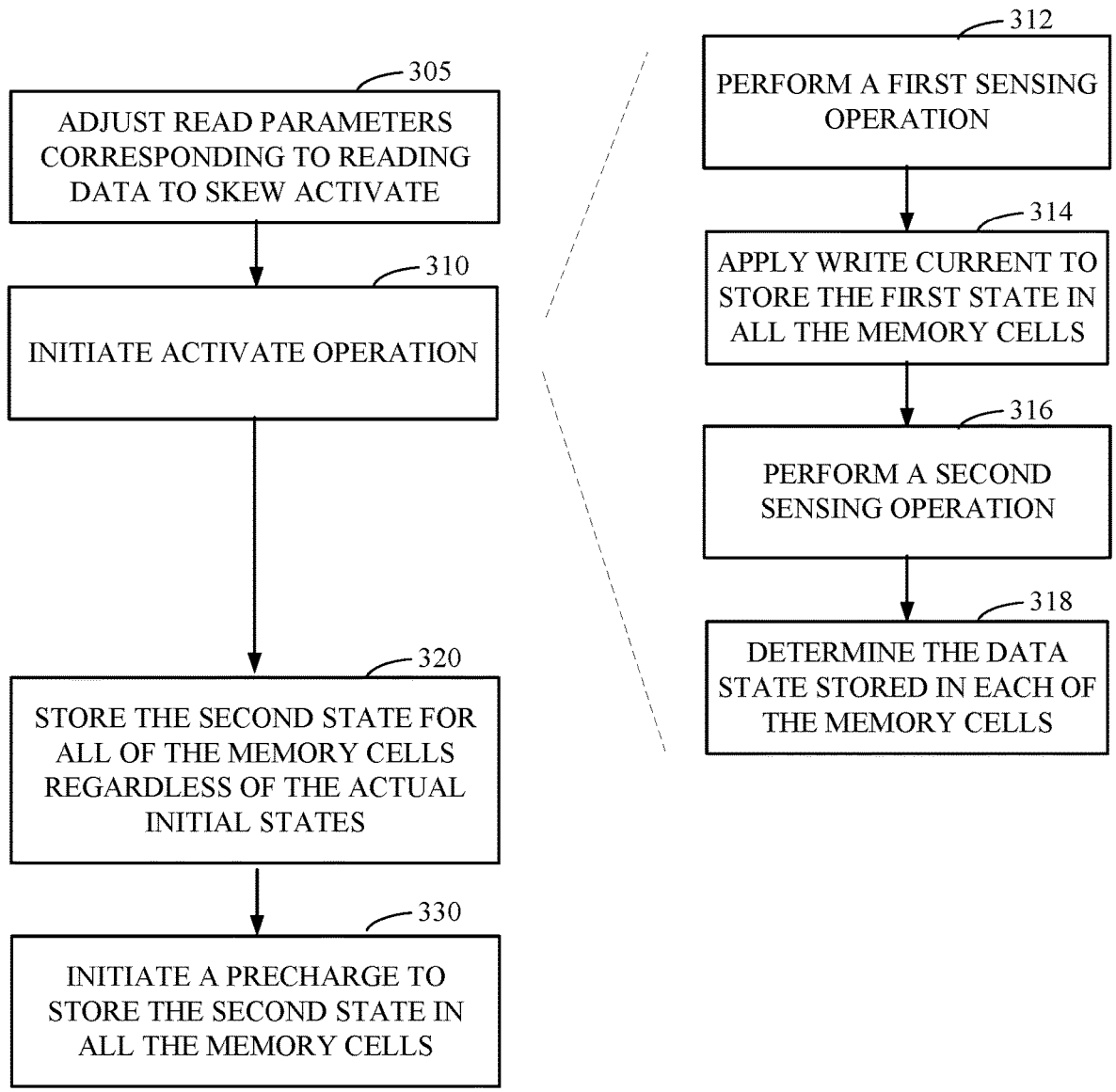
FIG. 3 is a flow chart of a method for testing a group of memory cells in accordance with an exemplary embodiment.

FIGS. 3-8 are flow charts that illustrate exemplary embodiments of methods of testing and configuring magnetic memory devices and portions thereof. The operations included in the flow charts may represent only a portion of the overall process used in testing/configuring the memory. For illustrative purposes, the following description of the methods in FIGS. 3-8 may refer to elements mentioned above in connection with FIGS. 1-2. It should be appreciated that methods may include any number of additional or alternative tasks, the tasks shown in FIGS. 3-8 need not be performed in the illustrated order unless specified otherwise, and the methods may be incorporated into a more comprehensive procedure or process having additional functionality not described in detail herein. Moreover, one or more of the tasks shown in FIGS. 3-8 can be omitted from an embodiment as long as the intended overall functionality remains intact FIG. 3 illustrates a flow diagram corresponding to a customized activate operation intended to exercise both the up-current write and down-current write aspects of all memory cells included in a particular page. At 305, read parameters corresponding to reading data are adjusted to skew the results of a subsequent activate operation. At 310, the activate operation is initiated. As shown in FIG. 3, the activate operation includes a first sensing operation 312, a write operation that stores the first state in all of the memory cells 314, a second sensing operation 316, and finally an evaluation stage 318 where the determination as to the data state stored in each of the memory cells within the page occurs. As discussed above, read parameters are adjusted in order to force the evaluation at 318 to determine that all of the data states for the memory cells in the page are the same. The data state determined can be the first state or the second state. In some embodiments, inversion of the entire page of data may be necessary such that the precharge operation at 330 results in opposite current flowing through all of the memory devices. In the example embodiment illustrated, at 320 the second state is stored as the data state for all of the memory cells within the page regardless of the actual data initially stored in each of the memory cells. At 330, precharging occurs and the second state is written to all of the memory cells in the page.

A customized or skewed activate operation such as that described above can be used to speed up certain testing operations used to help validate the long-term viability of the memory devices. As noted above, different stress tests can be used to exercise the selection transistors and the magnetoresistive devices included in the memory cells.

Figure 4:
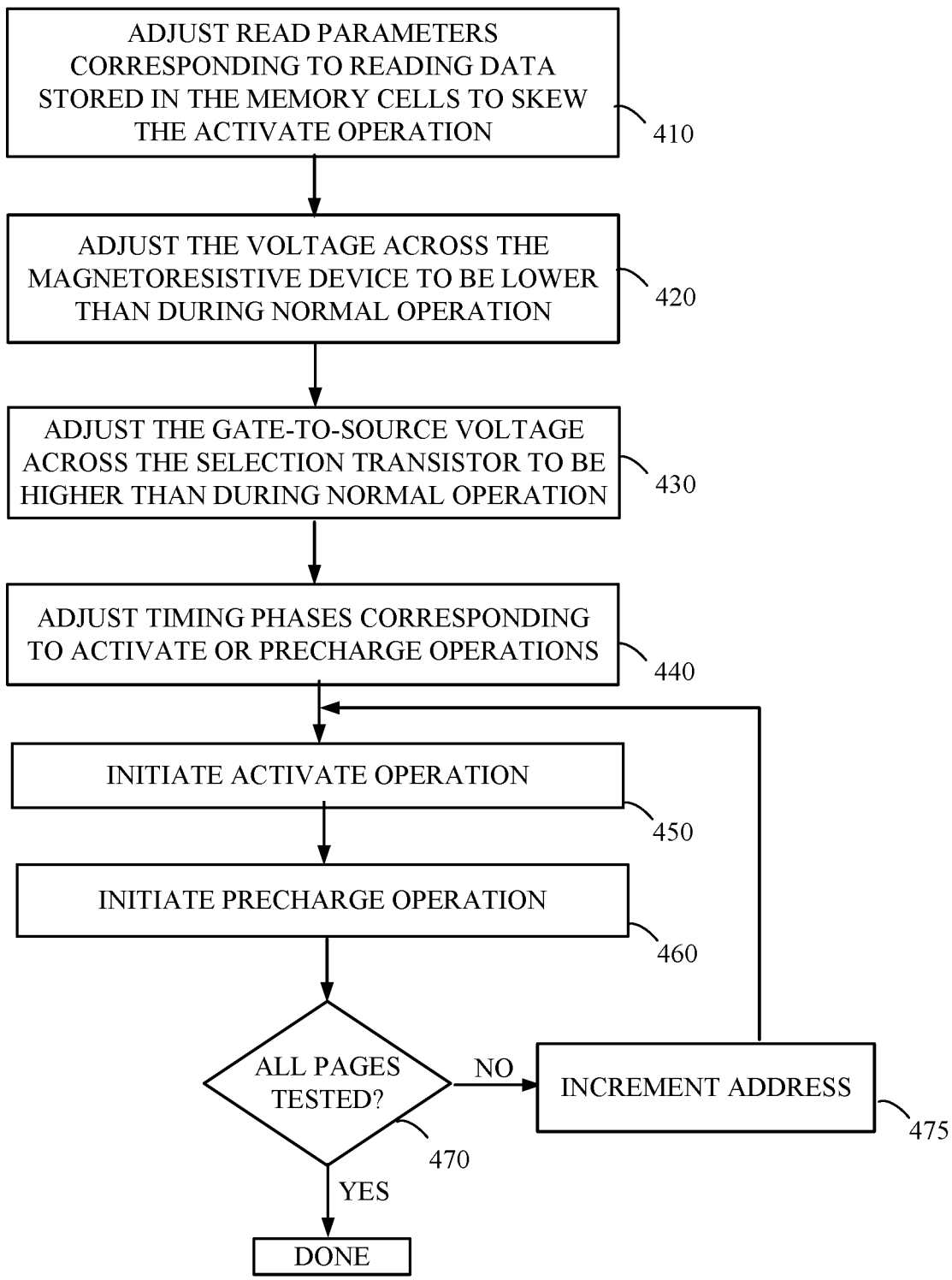
FIG. 4 is a flow chart of a method for stress-testing a portion of a memory cell in accordance with an exemplary embodiment.

FIG. 4 illustrates a flow diagram of a method for stressing the selection transistor portion of the memory cells. Such a method may be used as part of a burn-in or similar procedure intended to repeatedly stress the selection transistor in order to ensure its long-term viability in normal operation. At 410 one or more read parameters are adjusted to skew the activate operation to achieve a same-data value determination during activation for every memory cell in the page to be accessed. As discussed above, this can be accomplished by adjusting parameters such as the sense amplifier offset and/or the read bias level that is applied across the memory cell.

Because the testing performed in FIG. 4 is directed to the selection transistor, it is unnecessary to also stress the magnetoresistive device that includes the magnetic tunnel junction during this testing process. Such unnecessary stress to the magnetoresistive device could result in premature breakdown of the magnetoresistive device. As such, at 420 the voltage across the magnetoresistive device is adjusted to be lower than would be the case in normal operation. Because the stress applied to the selection transistor is focused on the gate-to-source voltage applied across the selection transistor, the actual current flow that occurs through the transistor, and hence through the magnetoresistive device with which it is connected in series, is unimportant. As such, adjusting the voltage across the magnetoresistive device at 420 can be accomplished by adjusting the bias voltage applied by the driver circuit coupled to the magnetoresistive device. For example, referring back to FIG. 1, the driver 130 can be controlled to drive a lower voltage onto the edge of the memory cell then would be the case during normal operation.

At 430 the gate-to-source voltage of the selected device is adjusted to be higher than would be the case in normal operation. For example, the $V_{GS}$ may be increased to be on the order of 20% greater than would be the case during normal operation. In one example embodiment, if the normal operating $V_{GS}$ is about 1.5V, the $V_{GS}$ may be increased to about 1.8V for stress testing. As noted, the test of FIG. 4 is directed to stressing the selection transistor, and, as such, a higher than normal gate-to-source voltage is applied such that susceptibility to break down may be detected more easily or more quickly. The adjustment to the gate-to-source voltage can be achieved by controlling the voltage driven on the word line and the voltage applied by the driver circuit on either side of the memory cell, depending on the direction of current flow. Assuming that the activate operation utilizes a down-current write, the driver 140 in FIG. 1 can allow for regulation of the source voltage while the word line 150 allows for regulation of the gate voltage.

At 440, timing phases corresponding to different aspects of the activate or precharge operation can be adjusted to help improve efficiency of the testing operation. For example, because the actual results of the sensing operations are less important in terms of accuracy, the time appropriated to such sensing operations can be reduced in order to speed up overall test time. Similarly, because the gate-to-source voltage applied during the writing aspect of the activate operation is being used to stress the selection transistor, the time during which the writing operation is performed can be extended to further increase the amount of stress on the selection transistor. In some embodiments, different configurations allow for multiple extended write pulses or alternating long and short pulses corresponding to the write operation in order to vary the type of stress and length of stress applied to the selection transistor.

The duration of different operations, bias voltages applied, and other variables associated with the testing can be controlled based on values stored in one or more registers on the memory device. Notably, different embodiments apply stress in different ways based on time variation, voltage variation or the like. While some embodiments depicted herein include variation of multiple parameters, some embodiments may only vary a single parameter or different combinations of parameters. Thus, for example, in some embodiments, the time phase adjustment at 440 may not be used as a part of the stress testing.

At 450 the activate operation is initiated. Activation may be initiated either by an external command or by test circuitry included on the memory device. As discussed above, the activate operation is used to provide stress associated with writing operations for the selection transistor of all memory cells within the page. Thus, in one embodiment where a down-current write is used as a part of a self-referenced read using during the activate operation, all memory cells within the page will be written to as a part of that self-referenced read operation. Thus, all of the selection transistors for all of the memory cells in the page will be stressed by application of the appropriate gate voltage. The timing and voltages applied during the activation operation at 450 can be altered or configured in order to maximize stress on the selection transistor as discussed above.

Following activation, precharging occurs at 460. Because the activation is a custom activation that detects the same data state in every memory cell, the precharge operation will force a write back to every memory cell in the page. As was the case with respect to the activate operation, stressing the selection transistor during precharge can include adjusting the gate-to-source voltage across the selection transistor for the up-current write associated with precharging. Similarly, the voltage across the magnetoresistive device can be held to a lower than normal level, and timing phases can be adjusted to help improve the efficiency of the stress testing during the precharge operation.

While not shown in FIG. 4, multiple iterations of activate operations followed by precharge operations can be performed for the same page within the memory device. For example, a particular page of memory cells may be repeatedly cycled through activate and precharge operations to determine the long term viability of those selection transistors. The results of such stressing may be used as representative of other memory cells within the array such that all of the pages are not subjected to the same stress-testing. Notably, the various parameters associated with the stress testing can either be maintained or modified for each iterative activate/precharge operation. Configuration and control of the testing can be accomplished based on-device test circuitry, register settings, fuse or other nonvolatile storage settings, or external input.

At 470 it is determined whether all of the pages intended to be exercised through the stress testing of FIG. 4 have been tested. If not, the method proceeds to 475 where the page address is incremented such that a new page can be subjected to stress. Different pages may be subjected to the same stress levels, or other parameter changes may occur to either increase the stress or decrease the stress as desired. If it is determined that all of the pages have been tested at 470, if the testing was controlled and monitored by on-chip testing circuitry, the results of the test may be recorded in storage on the memory device, or may be communicated externally. For example, after repeated stressing, a subsequent set of read/write operations can be performed to verify that the memory cells that have been stressed are still functioning normally. The results of such subsequent tests can be logged or communicated external to the memory device.

While the embodiment of FIG. 4 involves stressing the selection transistor for both up-current and down-current write situations, in other embodiments, deviations from normal operating parameters are only applied during either up-current or down-current situations. In yet other embodiments, different parameters are used for the different current direction stress testing.

Figure 5:
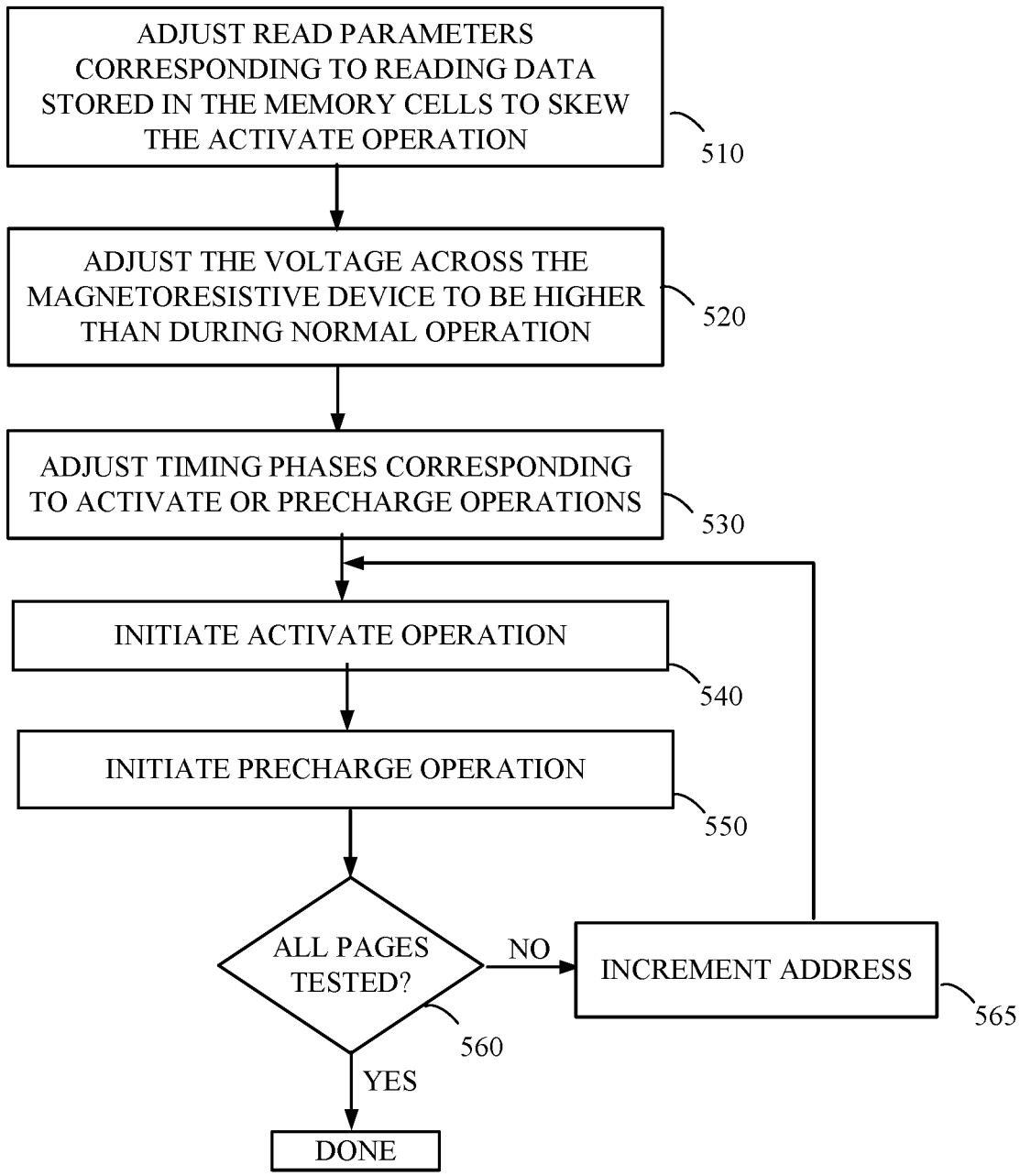
FIG. 5 is a flow chart of a method for stress-testing a portion of a memory cell in accordance with an exemplary embodiment.

FIG. 5 is a flow diagram corresponding to a method for stress testing the magnetoresistive devices within the memory cells. Thus, while the method illustrated in FIG. 4 focused on testing the selection transistors, the method illustrated in FIG. 5 focuses on the magnetoresistive devices, including stressing the magnetic tunnel junctions within such devices in order to determine if breakdown occurs. Such a method may be used as part of a burn-in or similar procedure.

At 510 a read parameter is adjusted to skew the activate operation to achieve a same-data value during activation for every memory cell in the page to be accessed. Because the testing performed in FIG. 5 is directed to the magnetoresistive device, it is unnecessary to also stress the selection transistor during this testing process. As such, the applied voltage at the gate of the selection transistor during this testing may coincide with that applied during normal operation. However, in order to increase the stress on the magnetoresistive devices for each of the memory cells, at 520 the voltage across the magnetoresistive device is adjusted to be higher than would be the case in normal operation. Adjusting the voltage across the magnetoresistive device at 520 can be accomplished by adjusting the bias voltage applied by the driver circuit coupled to the magnetoresistive device. For example, referring back to FIG. 1, the driver 130 can be controlled to drive a higher voltage onto the edge of the memory cell then would be the case during normal operation. In some embodiments, the bias voltage across the magnetoresistive device is increased by 20-40%. For example, if the bias voltage during normal operation is 0.5 V, the bias applied during stress testing may be a value within the 0.6-0.7 V range.

At 530, timing phases corresponding to different aspects of the activate or precharge operation can be adjusted to help improve efficiency of the testing operation. For example, sensing operations can be reduced in time and writing operations can be increased in frequency and/or duration. Similarly, because the voltage applied during the writing aspect of the activate operation is being used to stress the magnetoresistive device, the time during which the writing operation is performed can be extended to further increase the amount of stress on the magnetic tunnel junction in the magnetoresistive device. In some embodiments, different configurations allow for multiple extended write pulses or alternating long and short pulses corresponding to the write operation in order to vary the type of stress and length of stress applied to the selection transistor. As was the case with the stress testing of the selection transistors, the duration of different operations, bias voltages applied, and other variables associated with the testing can be controlled based on values stored in one or more registers or forms of nonvolatile storage on the memory device.

At 540 the activate operation is initiated. Activation can be initiated either by an external command or by test circuitry included on the memory device. The activate operation is used to provide stress associated with writing operations for the magnetoresistive devices of all memory cells within the page. Thus, in one embodiment where a down-current write is used as a part of a self-referenced read using during the activate operation, all memory cells within the page will be written to as a part of that self-referenced read operation. Thus, all of the magnetoresistive devices for all of the memory cells in the page will be stressed. As noted above, the timing and voltages applied during the activation operation at 540 can be altered or configured in order to control stress on the magnetoresistive devices.

Following activation, precharging occurs at 550. Because the activation is a custom activation that detects the same data state in every memory cell, the precharge operation will force a write back to every memory cell in the page. As was the case with respect to the activate operation, stressing the magnetoresistive devices during precharge can include adjusting the bias voltage across the magnetoresistive device for the up-current write associated with precharging. Similarly, timing phases can be adjusted to help improve the efficiency of the stress testing during the precharge operation.

While not shown in FIG. 5, multiple iterations of activate operations followed by precharge operations can be performed for the same page within the memory device. For example, a particular page of memory cells may be repeatedly cycled through activate and precharge operations to determine the long term viability of those magnetoresistive devices. Notably, the various parameters associated with the stress testing can either be maintained or modified for each iterative activate/precharge operation. As is the case with the stress testing of the selection transistors discussed above with respect to FIG. 4, configuration and control of the testing can be accomplished based on on-device test circuitry, register settings, nonvolatile storage, or external input.

At 560 it is determined whether all of the pages intended to be exercised through the stress testing of FIG. 5 have been tested. If not, the method proceeds to 565 where the page address is incremented such that a new page can be subjected to stress. Different pages may be subjected to the same stress levels, or other parameter changes may occur to either increase the stress or decrease the stress as desired. If it is determined that all of the pages have been tested at 560, the results of the test can be recorded in storage on the memory device, or may be communicated externally. For example, after repeated stressing, a subsequent set of read/write operations can be performed to verify that the memory cells that have been stressed are still functioning normally. The results of such subsequent tests can be logged or communicated external to the memory device.

While the stress testing of the selection transistors and the magnetoresistive devices are shown as separate routines in FIGS. 4 and 5, in other embodiments, stress testing of both the selection transistors and the magnetoresistive devices can be done together. For example, the selection transistors for a selected page may first be stressed and then the magnetoresistive devices for that same page stressed before a new page is tested. Various combinations of such stress testing are used in different embodiments and may be combined with other testing operations.

In addition to verifying functionality of the components of the memory cell 100 in both the short term as well as over the expected lifetime of the part, testing can be used to determine optimal parameters or settings to be applied for later testing or operation of the memory device. For example, when reading data from a memory cell, the particular bias voltage applied across the magnetoresistive device 110 can affect the accuracy of the reading operation. Similarly, the sense amplifier offset can be adjusted in order to optimize the ability of the sense amplifiers to accurately determine the data states stored within the memory cells.

Figure 6:
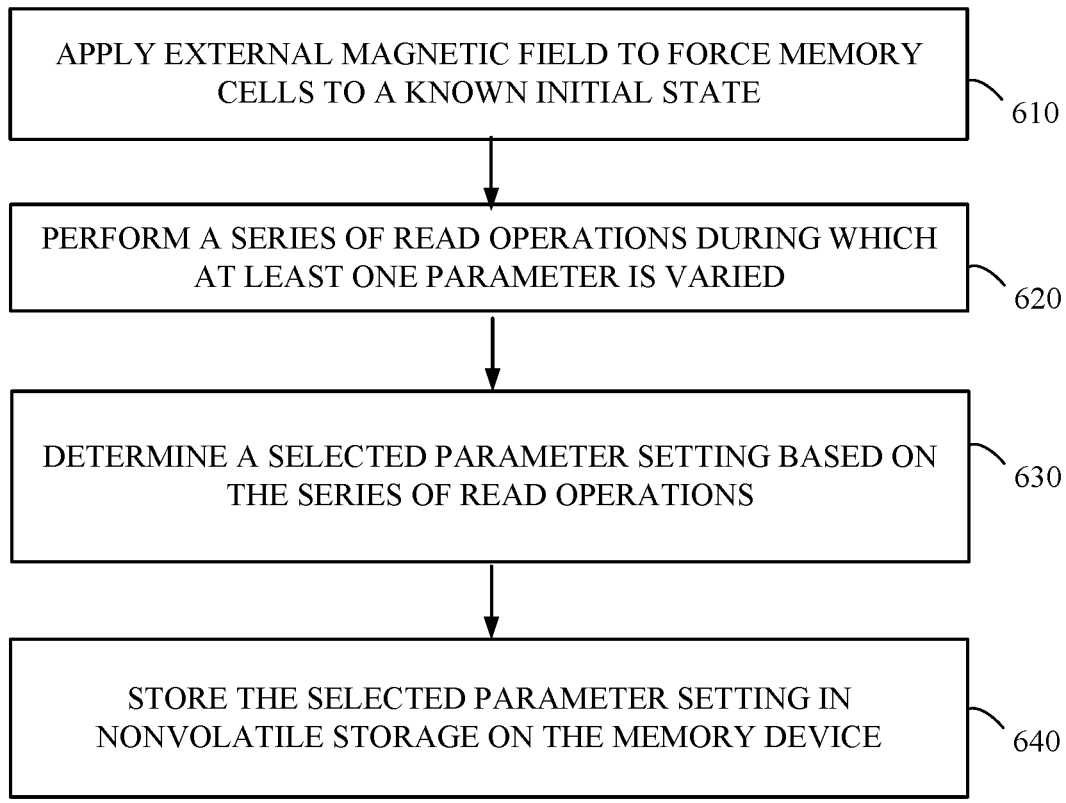
FIG. 6 is a flow chart of a method for configuring a memory device parameter setting in accordance with an exemplary embodiment.

FIG. 6 illustrates a flow diagram of a method for determining particular parameter settings that may be beneficial in a read operation in a magnetic memory device. In order to place all of the memory cells in the array in a particular initial state, at 610 an external magnetic field is applied to the memory device, where the externally applied field is of sufficient magnitude to switch all of the magnetic memory devices into one of the first state or the second state. Using such an external magnetic field to set the initial states for all of the memory devices is useful in that the state of the memory device for testing read operations is known without the potential uncertainty that could be injected if normal writing operations were used to set the initial state for testing read operations. In other words, if something was faulty with the write operation, that problem would infect the testing of read operations. Notably, other techniques may be employed to set the initial state of the memory cells for testing read operations, including block write operations or an operation in which all of the memory cells in a particular page or array are written to simultaneously.

At 620 series of read operations is performed for memory cells included on the memory device. During the performance of the series of read operations, at least one parameter is varied in order to "sweep" different values for that at least one parameter. For example, the read bias applied across the memory cell may be varied throughout the series of read operations, where, in one example, the read bias is gradually increased from some minimum value to some maximum value. The range through which the parameter is varied can be determined based on register settings or other storage within the memory device, and the series of read operations can be controlled based on testing circuitry included on the memory device or by externally applied commands. As discussed above, register settings within the memory device may be input using a serial scan chain in which the value is received via a serial interface and stored in the register on the memory device.

As discussed with respect to FIG. 3 above, the series of read operations performed at 620 may include a plurality of activate operations. As such, each read operation may include a self-referenced read, where the self-referenced read includes performing a first sensing operation for the memory cell, applying a write current through the memory cell to store a first data value in the memory cell, performing a second sensing operation after applying the write current, and then determining a data value stored in the memory cell based on the first sensing operation and the second sensing operation. While not shown in FIG. 6, an external magnetic field may be applied to force the memory cells to a known initial state prior to each self-referenced read operation in a series of read operations.

Once the activate operation has been performed, individual memory cell data values can be compared with expected values in order to ascertain whether the expected data state was determined based on the read operation. Thus, by comparing the data values determined from the read operation with expected values, the various parameters being varied throughout the series of read operations can be evaluated to determine beneficial parameter settings in order to accurately sense the data stored within the memory cells. In some embodiments, the read parameter that is varied is the sense amplifier offset, where either the first sensing operation or the second sensing operation included in the self-referenced read applies the sense amplifier offset in order to enable the sense amplifiers to readily detect whether or not the write included in the activate changed the state of the memory cell.

In another embodiment, the read parameter that is varied includes a timing parameter associated with at least one of the first and second sensing operations included in the self-referenced read. For example, the duration of time during which this first or second sensing operations occur can be varied in order to improve the speed with which the sensing can occur while still ensuring accurate sensing of what is stored within the memory cell. For example, too short of a sensing duration may prevent accurate data state determinations. Too long of a sensing duration might ensure accurate data state determination, but consume more time than is necessary, thereby decreasing overall memory access speed.

In other embodiments, the read parameter that is varied includes a bias voltage or a bias current applied during the memory cell the read operation. For example, different bias voltages applied across the memory cell can be tested to determine which bias voltages accurately determine the data states stored in the memory cells, while avoiding unnecessary high voltages that could damage the memory cell in some way.

In some embodiments, multiple read parameters are varied simultaneously during the series of read operations. For example, the sense amplifier offset sense timing can be varied while maintaining the read bias voltage at a constant level. Thus, various combinations of different parameter settings for the read operation can be tested in an attempt to determine preferred values to be used either during normal operation or during subsequent testing. Returning to FIG. 6, at 630 a selected parameter setting for the at least one parameter is determined based on the series of read operations. Thus, after cycling through numerous different values for the various parameters, a selected parameter setting is determined at 630. The selected parameter setting may be the preferred setting for subsequent testing or may be the preferred parameter setting for normal operation of the memory device in an attempt to achieve optimal performance. Determination as to the selected parameter setting can include comparing data values that are sensed through the read operation with expected values for the data stored in the memory cells, where a comparison between the expected values and what has been determined through the read operation can be analyzed to select the parameter setting for subsequent read operations.

At 640, the selected parameter settings are stored in nonvolatile storage on the memory device. Thus, after cycling through numerous potential parameter settings in order to determine preferred values, those settings can be stored in nonvolatile storage on the memory device for subsequent use in either testing or normal operation. For example, a preferred sense amplifier offset can be stored in a nonvolatile register or set of fuses on the memory device for later use in normal operation. In other embodiments, the testing performed in FIG. 6 may be a part of a wafer probe testing operation. In such embodiments, the preferred settings for the particular memory device can be determined at wafer probe, stored in fuses or other nonvolatile storage on the memory device, and then employed during subsequent testing, such as the stress testing described with respect to FIGS. 4 and 5 above. The selected parameter settings determined using the method illustrated in FIG. 6 may also be placed in storage that can be read from external to the memory device in order to influence subsequent modes of operation or testing. Device characteristics and settings determined during the testing of FIG. 6 may also be used in binning out the various devices in terms of separating out which devices provide different characteristics, including, for example, the highest speed operation or most consistent operation for lower voltage operations.

Figure 7:
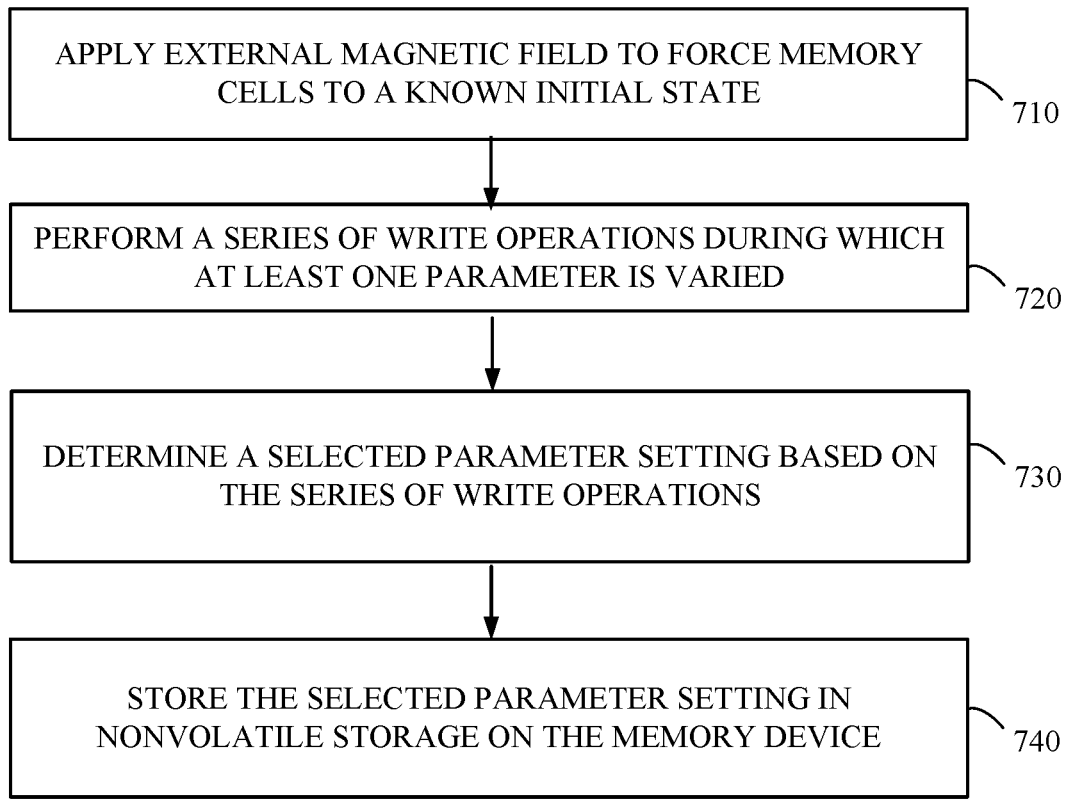
FIG. 7 is a flow chart of a method for configuring a memory device parameter setting in accordance with an exemplary embodiment.

FIG. 7 illustrates a method for determining appropriate parameters used during write operations for the memory device. As was the case with FIG. 6, it may be beneficial to have a known set of data value stored within the memory device before performing the various tests associated with configuring the appropriate write parameters for the memory device. As such, at 710 an external field can be applied to set the memory device into a known initial state where each memory cell stores a known value. Using this type of an external field may be employed numerous times throughout the testing operation. For example, FIG. 7 includes performing a series of write operations and then determining whether or not the values intended to be written have actually been stored within the memory device. It may be necessary to reset the memory device to a known state after each of the sets of write operations in order to make the determination as to whether or not the write actually occurred. For example, if all of the memory cells are initially set to the first state, and the write operation attempts to place certain memory cells into the second state, repeating that process with different parameter values may require the memory device to be placed in the initial first state once again before attempts to write certain memory cells to the second state can occur for the subsequent parameter value. In other embodiments, the series of write operations is performed using different page addresses for the memory device such that different memory cells are written each time and the memory cells do not need to be reset to an initial state.

At 720 a series of write operations for memory cells included on the memory device is performed. During the series of write operations at least one write parameter is varied. In some embodiments, the write parameter varied during the series of write operations is a timing parameter associated with current pulses through each memory cell during the write operations. For example, for an up-current write, the duration during which the write current is applied can affect whether or not the free portion of the magnetoresistive device is forced to the expected state based on the up-current write. Shorter lengths of time may not provide enough current to shift the free portion of the magnetoresistive device into the desired state. However, while a long burst of write current may be assured of moving the free portion of the memory cell to the desired state, it may consume unnecessary time and power in causing that transition, thereby decreasing the memory device speed and efficiency. As such, is desirable to determine a preferred length of time for the write pulse that assures proper operation that promotes high-speed, efficient operation.

In other embodiments, the write parameter that is varied includes the bias voltage or bias current applied to each memory cell during the write operation. Thus, the magnitude of the voltage across the memory cell and/or current through the memory cell impacts the effectiveness of the write operation. Various combinations of the appropriate timing and biases applied during write operations can be tested by performing the series of write operations at 720. The initial parameter settings or the range of parameter settings through which the series of operations vary the tested parameters may be set using a register on the memory device. As was the case with the parameters discussed above with respect to read operations, those parameters may be input over a serial interface and stored in a register on the device.

At 730 the selected parameter settings for the write parameters that have been tested are determined based on the series of write operations. If the memory device has been placed in an initial state (e.g. all memory cells storing a "0"), a comparison of result of the write operation with that initial known state (i.e. has the memory cell been changed to a "1")

be used to determine whether or not the write was successful. After sweeping the various values for the parameters to be configured, a preferred set of parameter settings can be determined for the memory device in order to optimize speed while minimizing power consumption and error rate.

At 740 the selected parameter settings for the write operations are stored in nonvolatile storage on the memory device. Thus, as was discussed with respect to FIG. 6 above, the parameter settings determined through this testing can be stored in fuses or other nonvolatile storage and later used in subsequent testing operations or normal operation. The parameter settings may also be accessible from external to the memory device such that the speed characteristics or voltage characteristics for the particular device are readily identifiable, thereby allowing for sorting of devices having different functional characteristics.

Figure 8:
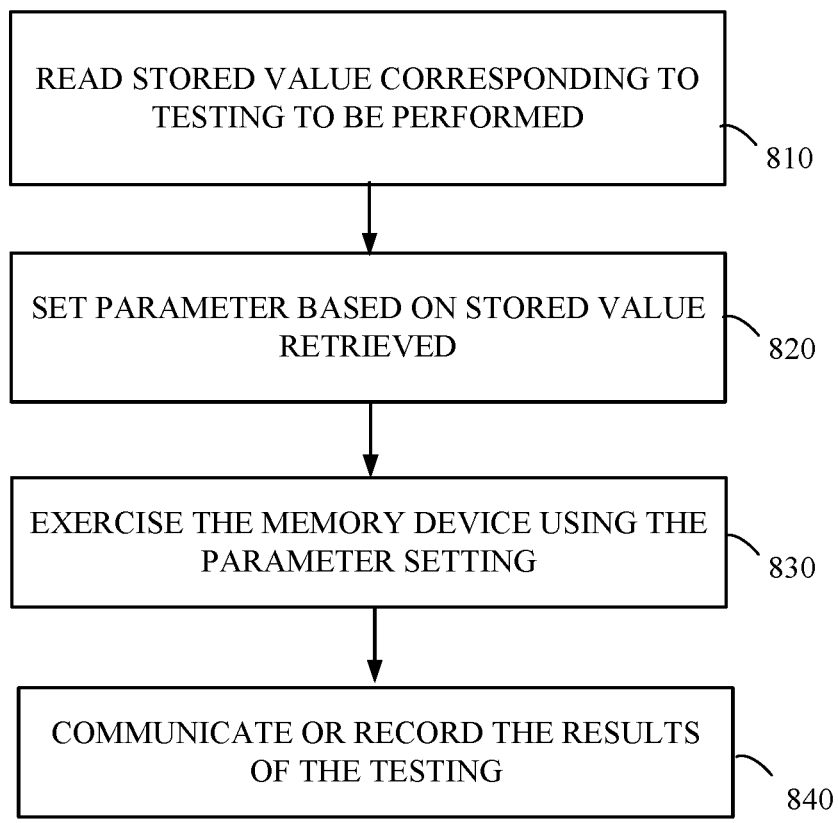
FIG. 8 is a flow diagram of a method for testing a memory device in accordance with an exemplary embodiment.

Thus, a register on the memory device can be used to store temporary settings that are used for evaluation of the parts, whereas nonvolatile storage such as fuses can be used to set particular configurations for the part based on the evaluations performed. FIG. 8 illustrates a method for testing a memory device using stored values where the results can be communicated following completion of the testing. At 810 a stored value corresponding to testing to be performed is read from storage on the memory device. Storage on the memory device may include a register or nonvolatile storage such as a fuse. In one example embodiment, the stored value corresponds to a preferred parameter setting to be used during stress testing (e.g. burn-in testing), where that value was stored in a set of fuses on the memory device as a result of testing performed during wafer probe.

At 820 a parameter corresponding to the testing to be performed is set based on the stored value retrieved. Thus, continuing with the example presented directly above, the stored value may indicate the read bias level or sense amplifier offset to be applied during burn-in testing. At 830 the memory device is exercised to using the parameter setting. Thus, repeated read or write operations using the parameter settings can be performed in order to determine the memory devices response to such operations under the conditions selected by the parameter setting.

At 840 the results of the testing are either communicated external to the memory device or recorded on the memory device for later retrieval. For example, a determination can be made as to whether or not the device successfully performs based on the retrieved parameter settings stored on the memory device. Therefore, the results may be as simple as a "pass" or "fail." In other embodiments, the stored parameters used for the testing in FIG. 8 may only be initial "base" values, where the method includes including slight adjustments to those values as a part of the testing performed. Based on the results of the testing, offset values may be stored, where the offset values are used to tweak the values originally stored during the earlier testing routines, where it has been determined through subsequent testing that those values are not optimal. For example, a particular read bias voltage may be selected during wafer probe for a memory device. A value indicating that read bias voltage can be stored in nonvolatile storage at wafer probe. Later stress testing retrieves that value and exercises the part using the encoded read bias value as a baseline bias point. If the stress testing determines that a slightly greater read bias voltage is needed to achieve the desired bit error rate, then further configuration of the part may be achieved by storing that offset on the memory device. When the device is then later used in normal operation, the read bias voltage employed may be based on both the value stored during wafer probe as well as the offset stored during later stress testing. In other examples, parameter 820 may correspond to a write voltage parameter that is based on a value stored in a register or fuse.

Notably, the stress tests discussed above with respect to FIGS. 4 and 5 may be used in conjunction with the sweeping of different parameter settings associated with FIGS. 6 and 7. In other embodiments, the comparisons performed in FIGS. 6 and 7 for different parameter settings can be used in conjunction with the bit error rate for the memory device to determine the preferred parameter settings. Based on an acceptable bit error rate per number of memory cycles, the settings for the memory device can be determined. Subsequent stress testing can monitor that bit error rate to determine if it is maintained over repeated use of the memory device. If there is a steep increase in the bit error rate over time is seen, the memory device may be faulty and thus discarded. If, however, the bit error rate remains generally consistent over repeated cycling, that can provide confirmation of both the parameter settings and the expected longevity of the part in normal operation.

The testing performed on the memory devices can include initial coarse screening and then finer screening. For example, a single page or bank in memory can be repeatedly cycled to see whether or not the bit error rate changes dramatically. In one example, a single row within the memory device may be cycled for a long period of time to monitor the bit error rate for that particular row. Thus, whereas testing a few cycles on the majority of the memory array can help ensure general functionality, extensive cycling of particular portions of the memory can be used as an indicator as to the general expectations in terms of memory cell longevity for the entire part.

In some embodiments, a redundant row of memory cells may be exercised with the intention of pushing those memory cells to the point of failure. By determining the point in which the memory devices fail, the parameter settings for normal operation of the remainder of the memory device can be influenced by that determination. As such, the memory device may be designed to include a redundant row of sacrificial memory cells that are expected to be nonfunctional in normal operation. Various register settings in the test circuitry for the memory device can be used to configure where such redundant cells are located within the memory array and how they are mapped into or out of the address space supported by the memory device.

If the redundant memory cells included in the array are not intended to be used during normal operation, their characteristics can be intentionally altered during processing in order to allow for more extensive testing then might be possible with memory cells associated with normal operation. For example, larger selection transistors, different magnetoresistive device configurations, different interconnect circuitry, or a different sense amplifier designs can be employed with respect to the redundant memory cells included on the memory device. While the area consumed by such redundant memory cells can be limited in terms of only having a small set of such redundant memory cells, the information that may be obtained by exercising such non-typical memory cells can be very beneficial in terms of characterizing the memory device and allowing for parameter optimization for use in normal operation.

The methods and algorithms of FIGS. 3-8 can be implemented in many ways. In some embodiments, they are implemented in a tester through software. In alternate embodiments, built-in-self-test (BIST) circuitry, which may reside on the same die as the MRAM device, is used to implement the methods. Such BIST circuitry can be realized using state-machines, registers, and logic. In such embodiments, internal signals, external signals, or user input can trigger the BIST circuitry to perform one or more sequences of operations from any of FIGS. 3-8 in the memory device 200. Such BIST circuitry eliminates the need for software implementation of the tests and algorithms in a tester, and therefore a relatively simple tester can be utilized to exercise certain aspects of the parts while the BIST circuitry performs the operations discussed above. In other embodiments, BIST circuitry, or circuitry performing a similar function, is implemented on a separate die (e.g. that including a microprocessor, microcontroller, or system-on-chip) that is coupled to MRAM device 200 such that it can exercise and test the MRAM device 200 in the various manners discussed above. In yet other embodiments, the BIST circuitry is included on the same die as a microprocessor, microcontroller, or system-on-chip that also includes embedded MRAM. In such embodiments, the BIST circuitry can apply any one of the tests and methods discussed above with respect to FIGS. 3-8 to exercise and/or test the embedded MRAM.

While exemplary embodiments have been presented above, it should be appreciated that many variations exist. Furthermore, while the description uses spin-torque MRAM devices that include memory cells in a specific example arrangements, the teachings may be applied to other devices having different architectures in which the same concepts can be applied. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A method for configuring write parameters used during write operations for a spin torque memory device that includes a plurality of memory cells, the method comprising:
performing a first series of write operations for memory cells included on the spin torque memory device, wherein a timing parameter associated with a current pulse width of a spin-polarized current through each memory cell is varied during performance of the first series of write operations;
determining a first selected parameter setting for the current pulse width of the spin-polarized current for write operations based on the first series of write operations, wherein determining the first selected parameter setting includes detecting whether or not each write operation in the first series of write operations was successful and identifying at least one of a speed, an error rate, and a power consumption for the first series of write operations;
storing the first selected parameter setting in a register on the spin torque memory device;
performing a second series of write operations for the memory cells included on the spin torque memory device, wherein performing the second series of write operations comprises varying at least one of a bias voltage and a bias current through each memory cell during performance of a series of up-current write operations;
determining a second selected parameter setting for the at least one of a bias voltage and a bias current for write operations based on the second series of write operations, wherein determining the second selected parameter setting includes detecting whether or not each write operation in the second series of write operations was successful; and
storing the second selected parameter setting in the register on the spin torque memory device such that the second selected parameter setting stored in the register corresponds to at least one of an up-current bias voltage and an up-current bias current to be applied during up-current write operations.

2. The method of claim 1, wherein the plurality of memory cells includes nonvolatile memory cells.

3. The method of claim 2, wherein the plurality of memory cells includes magnetic memory cells, wherein each memory cell includes a magnetoresistive device coupled in series with a selection transistor.

4. The method of claim 1, wherein determining the first selected parameter setting further comprises:
reading stored data values in the memory cells;
comparing the stored data values in the memory cells with values written during the first series of write operations; and
determining the first selected parameter setting based on the comparison of the stored data values determined with the values written.

5. The method of claim 1, further comprising:
performing a third series of write operations for the memory cells included on the spin torque memory device, wherein performing the third series of write operations comprises varying at least one of a bias voltage and a bias current through each memory cell during performance of a series of down-current write operations;
determining a third selected parameter setting for the at least one of a bias voltage and a bias current for write operations based on the third series of write operations, wherein determining includes detecting whether or not each write operation in the third series of write operations was successful; and
storing the third selected parameter setting in the register on the spin torque memory device such that the third selected parameter setting stored in the register corresponds to at least one of a down-current bias voltage and a down-current bias current to be applied during down-current write operations.

6. The method of claim 1, wherein the second selected parameter setting stored in the register corresponds to at least one of a bias voltage and a bias current to be applied for write operations during subsequent testing of the spin torque memory device.

7. A spin torque memory device, comprising:
an array of memory cells; and
control circuitry coupled to the array of memory cells, wherein the control circuitry is configured to:
perform a first series of write operations for memory cells included in the array of memory cells, wherein a timing parameter associated with a current pulse width of a spin-polarized current through each memory cell is varied during performance of the first series of write operations;

determine a first selected parameter setting for the current pulse width for write operations based on the first series of write operations, wherein determining the first selected parameter setting includes detecting whether or not each write operation in the first series of write operations was successful and identifying at least one of a speed, an error rate, and a power consumption for the first series of write operations;

store the first selected parameter setting in a register on the spin torque memory device;

perform a second series of write operations for the memory cells included on the spin torque memory device, wherein performing the second series of write operations comprises varying at least one of a bias voltage and a bias current through each memory cell during performance of a series of up-current write operations;

determine a second selected parameter setting for the at least one of a bias voltage and a bias current for write operations based on the second series of write operations, wherein determining the second selected parameter setting includes detecting whether or not each write operation in the second series of write operations was successful; and store the second selected parameter setting in the register on the spin torque memory device such that the second selected parameter setting stored in the register corresponds to at least one of an up-current bias voltage and an up-current bias current to be applied during up-current write operations.

8. The spin torque memory device of claim 7, wherein the array of memory cells includes nonvolatile memory cells.

9. The spin torque memory device of claim 7, wherein the array of memory cells includes magnetic memory cells, wherein each memory cell includes a magnetoresistive device coupled in series with a selection transistor.

10. The spin torque memory device of claim 7, wherein the control circuitry is further configured to:
read data values stored in the array of memory cells;
compare the data values stored in the array of memory cells with values written during the first series of write operations; and
determine the first selected parameter setting based on the comparison of the stored data values with the written values.

11. The spin torque memory device of claim 7, wherein the control circuitry is further configured to:
perform a third series of write operations for the array of memory cells included on the spin torque memory device, wherein performing the third series of write operations comprises varying at least one of a bias voltage and a bias current through each memory cell during performance of a series of down-current write operations;
determine a third selected parameter setting for the at least one of bias voltage and a bias current for write operations based on the third series of write operations, wherein determining includes detecting whether or not each write operation in the third series of write operations was successful; and
store the third selected parameter setting in the register on the spin torque memory device such that the third selected parameter setting stored in the register corresponds to at least one of a down-current bias voltage and a down-current bias current to be applied during down-current write operations.

12. The spin torque memory device of claim 7, wherein the second selected parameter setting stored in the register corresponds to at least one of a bias voltage and a bias current to be applied for write operations during subsequent testing of the spin torque memory device.

13. A method of operation for a magnetoresistive random access memory for a spin torque memory device, wherein the magnetoresistive random access memory includes an array of non-volatile magnetoresistive memory cells, the method comprising:
performing a first series of write operations for non-volatile magnetoresistive memory cells included on the random access memory, wherein a timing parameter associated with a current pulse width of a spin-polarized current through each non-volatile magnetoresistive memory cell is varied during performance of the first series of write operations;
determining a first selected parameter setting for the current pulse width for write operations based on the first series of write operations, wherein the first selected parameter setting includes detecting whether or not each write operation in the first series of write operations was successful and identifying at least one of a speed, an error rate, and a power consumption for the first series of write operations;
storing the first selected parameter setting in a register on the magnetoresistive random access memory;
performing a second series of write operations for the memory cells included on the spin torque memory device, wherein performing the second series of write operations comprises varying at least one of a bias voltage and a bias current through each memory cell during performance of a series of up-current write operations;
determining a second selected parameter setting for the at least one of a bias voltage and a bias current for write operations based on the second series of write operations, wherein determining the second selected parameter setting includes detecting whether or not each write operation in the second series of write operations was successful; and
storing the second selected parameter setting in the register on the spin torque memory device such that the second selected parameter setting stored in the register corresponds to at least one of an up-current bias voltage and an up-current bias current to be applied during up-current write operations.

14. The method of claim 13, wherein each non-volatile magnetoresistive memory cell of the array is coupled in series with a selection transistor.

15. The method of claim 13, wherein determining the first selected parameter setting further comprises:
reading data values stored in the non-volatile magnetoresistive memory cells;
comparing the data values stored in the non-volatile magnetoresistive memory cells with values written during the first series of write operations; and
determining the first selected parameter setting based on a comparison of the stored data values determined with the written values.

16. The method of claim 13, further comprising:
performing a third series of write operations for the non-volatile magnetoresistive memory cells included on the magnetoresistive random access memory, wherein performing the third series of write operations comprises varying at least one of a bias voltage and a bias current through each non-volatile magnetoresistive memory cell during performance of a series of down-current write operations;

determining a third selected parameter setting for the at least one of a bias voltage and a bias current for write operations based on the third series of write operations, wherein determining includes detecting whether or not each write operation in the third series of write operations was successful; and storing the third selected parameter setting in the register on the magnetoresistive random access memory such that the third selected parameter setting stored in the register corresponds to at least one of a down-current bias voltage and a down-current bias current to be applied during down-current write operations.

17. The method of claim 13, wherein the second selected parameter setting stored in the register corresponds to at least one of a bias voltage and a bias current to be applied for write operations during subsequent testing of the magnetoresistive random access memory.

* * * * *